United States Patent
Bordui et al.

(12)

(10) Patent No.: US 6,319,430 B1
(45) Date of Patent: *Nov. 20, 2001

(54) PRECONDITIONED CRYSTALS OF LITHIUM NIOBATE AND LITHIUM TANTALATE AND METHOD OF PREPARING THE SAME

(75) Inventors: Peter F. Bordui, Eindhaven (NL); Dieter H. Jundt, Palo Alto, CA (US); Richard G. Norwood, San Jose, CA (US); Eugene M. Standifer, Mountain view, CA (US)

(73) Assignee: Crystal Technology, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/434,673

(22) Filed: Nov. 5, 1999

Related U.S. Application Data

(63) Continuation-in-part of application No. 08/900,179, filed on Jul. 25, 1997, now abandoned.

(51) Int. Cl.$^7$ .............................. G02B 5/20; C30B 33/06; C01G 23/00
(52) U.S. Cl. ............................... 252/584; 117/3; 423/593; 423/598
(58) Field of Search ............................ 252/584, 62.9 R; 117/3; 423/593, 598

(56) References Cited

U.S. PATENT DOCUMENTS 6,051,062 * 4/2000 Kawaguchi et al. ..................... 117/3

OTHER PUBLICATIONS

Rauber, A. "Chemistry and Physics of Lithium Niobate," Material Science, vol. 1, pp. 481–601, Chapter 7, 1978.

Dutt et al. "Optical Absorption and Electron Paramagnetic Resonance Studies of Chemically Reduced Congruent Lithium Niobate," J. Phys. Chem. Solids, 51:5, pp. 407–415, 1990.

Jhans et al. "Optical properties of reduced $LiNbO_3$" J. Phys. C: Solid State Phys. 19 (1986) 3649–3658.

Ajay Dhar and Abhai Mansingh "Optical properties of reduced lithium niobate single crystals" J. Accl. Phys. 68:11, pp. 5804–5809, 1990.

Ajay Dhar and ABhai Mansingh "On the correlation between optical and electrical properties in reduced lithium niobate crystals" J. Phys. D: Appl. Physics, 1991, pp. 1644–1648.

G. Bergmann "The Electrical Conductivity of $LiNbO_3$" Solid State Comm. vol. 6, pp. 77–79, 1968.

Stephen G. Boyer and Dunbar P. Birnie, III "Investigation of the Nb–rich phase boundary of $LiNbO_3$" SPIE vol. 968, pp. 73–80, 1988.

"Laser Induced Damage in Optical Materials: 1972", Proceedings of a Symposium Sponsored by The American Society for Testing and Materials and by the National Bureau of Standards, Jun. 14–15, pp. 15–24, 1972.

Paul J. Jorgensen and Robert W. Bartlett "High Temperature Transport Proceses in Lithium Niobate" J. Phys. Chem. Solids, 30:2639–2648.

A.B. Sherman and V.V. Lemanov, "Absorption of Elastic Waves in Reduced $LiNbO_3$" Soviet Physics—Soviet State, 13:6, pp. 1413–1415, 1971.

* cited by examiner

Primary Examiner—Philip Tucker
(74) Attorney, Agent, or Firm—Fish & Richardson P.C.

(57) ABSTRACT

Crystals of lithium niobate and lithium tantalate are preconditioned to intentionally increase their electrical conductivity, thus providing crystals with an increased ability to reduce surface charging. Reducing surface charging reduces the risk that the crystals may catastrophically discharge, and adversely affect the performance of devices in which the crystal is incorporated.

6 Claims, No Drawings of the crystal or in response to a mechanical stress applied
PRECONDITIONED CRYSTALS OF LITHIUM NIOBATE AND LITHIUM TANTALATE AND METHOD OF PREPARING THE SAME This application is a continuation-in-part of prior U.S. application Ser. No. 08/900,179 entitled PRECONDITIONED CRYSTALS OF LITHIUM NIOBATE AND LITHIUM TANTALATE AND METHODS OF PREPARING THE SAME, filed on Jul. 25, 1997 now abandoned.

FIELD OF THE INVENTION

The present invention relates to improved crystals of lithium niobate and lithium tantalate and methods of preconditioning such crystals for use in electrical applications such as surface acoustic wave filter devices.

BACKGROUND OF THE INVENTION

Lithium niobate (LN) and lithium tantalate (LT) are widely used in a variety of electronic applications including surface acoustic wave (SAW) signal processing, guided-wave optic modulation and switching, and electro-optic laser Q-switching, and modulation. The physical basis for the suitability of LN and LT crystals for these types of applications is their atomic-scale crystal structure, which results in the crystals' natural piezoelectric response useful in SAW-based devices, electro-optic response useful in integrated optic devices and pyroelectric response useful in pyroelectric detectors. Another characteristic of LN and LT that may be important in some applications is the optical absorption of the crystal. For example, integrated optic devices require a relatively small optical absorption, while other devices; such as SAW filters do not require a low optical absorption. In some instances, this natural physical response of the crystals can complicate crystal processing and adversely effect performance of devices in which the crystals are incorporated.

A crystal's pyroelectric or piezoelectric response causes the external surfaces of a fabricated crystal to become electrically charged in response to a change in temperature of the crystal or in response to a mechanical stress applied to the crystal. These electrical surface charges can spontaneously short, with associated sparking causing dramatic processing or performance failure, or even crystal fracture. One common example of such performance failure is an unacceptably high bit-error-rate of LN-based SAW filters used in digital radio applications. In order to avoid such types of failures, current production protocols for these types of filters include extensive and costly device testing designed to eliminate those filters prone to such spurious pyroelectric or piezoelectric induced failures.

The process of incorporating LN or LT crystals into electronic devices often includes steps that result in exposing the crystals to conditions that invoke an untimely and unwanted pyroelectric or piezoelectric response. In an effort to reduce the risk of problems associated with the unintended build up of surface charges, for example catastrophic discharge of these charges during manufacture, device manufacturers have had to take steps that add significantly to the cost, time, and complexity of incorporating the crystals into devices.

For LN and LT crystals manufactured by conventional methods, surface charges can eventually decay with time as they are neutralized by the movement of free charge from within the crystal itself or from the surrounding environment. This natural decay occurs after the surface charge develops and does nothing to mitigate or minimize the degree to which the surface of the crystal becomes charged as a result of the crystal's natural piezoelectric or pyroelectric response.

In view of the increasing demand for reliable LN and LT crystals for applications such as surface acoustic wave filter devices, guided wave optic modulation and switching, and electro-optic Q-switching and modulation, the need exists for LN and LT crystals that continue to exhibit properties that make them desirable for such applications and that do not suffer from the drawbacks associated with the buildup of excessive spurious pyroelectric or piezoelectric surface charges.

SUMMARY OF THE INVENTION

In accordance with the present invention, crystals of LN or LT are preconditioned to increase the ability of the crystal to reduce electrical charging of the crystal surface. Crystals of the present invention are able to reduce electrical charging by effectively reducing or dissipating the buildup of surface electric charges (caused by the natural pyroelectric or piezoelectric response of the crystal) preferably as fast as the charges are generated.

The present invention also relates to a method for preconditioning or an LN or LT crystal to increase the crystal's ability to reduce electric charging of the crystal's surface. In a preferred embodiment of the method aspect of the present invention, the ability of the crystal to reduce electric charging of the crystal's surface is increased by exposing the crystal to a combination of heat and a chemically reducing atmosphere to increase the free electron density within the crystal, followed by a controlled quenching of the resulting crystal to a temperature ranging between about 250° C. to about 100° C. After the crystal is quenched it may be cooled to room temperature under either an oxidizing or a reducing atmosphere.

The present invention provides crystals which can effectively minimize the buildup of electric charges on the crystal surface that are induced by the crystal's natural pyroelectric or piezoelectric response, particularly those surface charges that build up as a result of mechanical stress or temperature change not associated with the normal operation of the device in which the crystal is incorporated. In a preferred embodiment, the preconditioned crystal is able to reduce surface charging by neutralizing or dissipating these charges as fast as they are generated.

DETAILED DESCRIPTION OF THE PREFERRED EMBODIMENT

The LN (the compound formed from $Li_2O$ and $Nb_2O_5$) and LT (the compound formed from $Li_2O$ and $Ta_2O_5$) crystals of the present invention exhibit piezoelectric and pyroelectric responses that make the crystals suitable for applications such as surface acoustic wave (SAW) signal processing, guided-wave optic modulation and switching, and electro-optic laser Q-switching and modulation. The present invention is described below in the context of LN crystals; however, the description is believed to be equally applicable to other types of crystals such as LT.

LN and LT crystals can be grown by a number of techniques, the best known of which is the Czochralski technique. A summary of the Czochralski technique can be found in Current Topics and Material Science, Vol. 1, E. Kaldis editor, North Holland Publishing Co., 1978, ch. 7 by Dr. Armin Räuber, p. 545–48, which is herein incorporated by reference. LN crystals grown by the Czochralski technique are achieved by pulling LN from a melt. Nearly any kind of conventional crystal pulling apparatus can be used. The crucible in which the LN is heated can be platinum. There are no special demands for the atmosphere, with air in many situations being preferred.

As noted in the background of the invention, LN crystals exhibit a natural piezoelectric and pyroelectric response. As a result, as illustrated in the Comparative Example set forth below, LN crystals in the form of wafers build up surface charges when subjected to a temperature change, such as those encountered when such crystals are processed and incorporated into electrical devices, or when the devices are used. These surface charges, which can take extended periods of time (e.g., 15–20 hours) to dissipate naturally, can cause sparking or shorting, which can lead to device malfunction or failure or even crystal fracture. In contrast, as described in the Example that follows the Comparative Example, preconditioned LN wafers of the present invention are able to effectively reduce the buildup of at least a portion of surface charges resulting from the crystal's natural pyroelectric response. By effectively reducing surface charging, (1) the risk of sparking is reduced, and the risk of device failure can be reduced; and (2) the need for costly and time intensive processing steps normally used to reduce the buildup of surface charging is avoided.

While not intended to be limited to any particular theory, it is believed that the observed reduction in surface charging for preconditioned crystals of the present invention is a result of the increased electrical conductivity of the preconditioned crystals compared to crystals that have not been preconditioned. Preferably, the crystal's electrical conductivity is increased without a significant change in other physical and electrical properties that make the crystal desirable for its intended purpose. The increase in electrical conductivity is believed to result from an effective change in the oxidation state of a portion of the niobium or tantalum from a +5 oxidation state to a +4 oxidation state. The resulting increase in electron density is believed to increase the electronic conductivity of the crystal, which allows the crystal to more rapidly neutralize or dissipate surface charges resulting from the natural piezoelectric or pyroelectric response of the crystal. A preferred process for preconditioning LN crystals is described below. Other techniques capable of increasing the electronic conductivity of the crystal without adversely affecting the other physical and electrical properties of the crystal can also be used to increase the ability of a LN or LT crystal to reduce surface charging in accordance with the present invention. The specific process described below is preferred, due to its simplicity and ease of control.

LN or LT crystals of the present invention have been treated to increase the crystal's ability to neutralize or dissipate electrical charges on the crystal surface. Preconditioned crystals that have been preconditioned using the method of a preferred embodiment, unlike crystals that have not been preconditioned, exhibit a color ranging from light grey to dark blue or black. The crystals may be lightly colored or they may be opaque, depending on the conditions that are used to precondition the crystal. In view of this color change, the preconditioned crystals of the preferred embodiment are preferred for applications where optical absorption is not a critical crystal property. The preconditioned crystals, after being exposed to conditions that invoke a pyroelectric response, exhibit a surface charge that is less than the surface charge that is observed from crystals exposed to the same conditions that have not been preconditioned according to the present invention. In certain situations, as described below in the Example, preconditioned crystals of the preferred embodiment do not exhibit any measurable pyroelectric charge after being exposed to a temperature change that normally invokes a pyroelectric response that results in the formation of a measurable surface charge.

One process for preconditioning an LN crystal in accordance with the present invention involves exposing wafers of LN crystals to heat under a chemically reducing atmosphere. After the wafers are exposed to the desired temperature for a predetermined period of time, they are quenched by cooling the crystals to a temperature ranging between about 250° C. to about 100° C. under a chemically reducing atmosphere. The quenched crystals are then preferably allowed to cool to room temperature under either a reducing atmosphere or an oxidizing atmosphere, such as air. Suitable preconditioning of LN crystal wafers can be achieved by exposing the wafers to target temperatures in an oven greater than about 500° C. under an 85% nitrogen gas and 15% hydrogen gas atmosphere for dwell times on the order of about one to about 200 minutes. After the wafers have been exposed to the target temperature for the predetermined period of time they can be quenched in the oven by cooling the crystals in the oven under the same reducing atmosphere under which they were initially heated or under a different reducing atmosphere. It is preferred that the crystals be quenched under a reducing atmosphere, (as opposed to an oxidizing atmosphere) to avoid a reversal of the reduction that occurred at the higher temperatures. The purpose of the quench is to cool the crystals while maintaining the non-equilibrium condition that results from the initial heating step under the chemically reducing atmosphere. Without being bound by theory, it is believed that initial heating step under a chemically reducing atmosphere imparts a metastable condition to the crystal wherein the crystal is not at equilibrium with respect to its oxygen content. It is believed that the quenching step effectively "locks in" this metastable state. To effectively lock in this non-equilibrium condition, it is believed necessary to carry out the quenching step under a chemically reducing atmosphere in order to minimize or avoid the reversal of the reduction achieved in the initial heating step. Once the crystals reach a temperature of about 100° C. or less, they can be cooled to room temperature under either a chemically reducing atmosphere or an oxidizing atmosphere. If cooling of the quenched crystal is to be carried out under an oxidizing atmosphere, it is preferred that the introduction of the oxidizing atmosphere occur after the temperature of the crystal has dropped below about 100° C., so as to minimize any oxidation of the reduced crystal.

As illustrated in the Example that follows, the preconditioned crystal wafers that have been exposed to conditions that invoke a pyroelectric response exhibit surface charges that are less than the surface charges that build up on identical wafers that have been exposed to the same conditions but have not been preconditioned in accordance with the present invention. In addition, when a detectable surface charge is observed, the length of time required for the surface charge to decay below detectable levels using a conventional electrostatic field meter is less for preconditioned crystals compared to crystal wafers that have not been preconditioned.

In addition to those described above and in the Example that follows, other target temperatures, heat up and cool down rates, dwell times and atmospheres suitable for increasing the ability of the crystal to reduce surface charging without adversely affecting the desirable performance properties of the crystal can be employed. For example, in addition to the hydrogen and nitrogen gas mixture described below, other gases such as hydrogen alone, nitrogen alone, argon, water, carbon dioxide, carbon monoxide, and combinations thereof can be used in accordance with the present invention. A combination of 85% nitrogen gas and 15% hydrogen gas is preferred because of its ready availability from numerous commercial sources. It is contemplated that different gas mixtures will provide different results so far as the extent of the reduction that is achieved.

The rate at which the crystal wafers are heated is not believed to be critical. Effective preconditioning of LN crystals can be achieved at heat up rates of about 6° C. to about 7° C. per minute. Likewise, the cool down rate is not believed to be critical and effective preconditioning of LN crystals can be achieved at cool down rates ranging from about 0.5° C. to about 100° C. per minute have provided satisfactory results. Other heating rates and cooling rates that are either greater or less than those set forth above may also be used.

Effective preconditioning is achieved at oven temperatures above 500° C. Preferably, the oven temperature ranges from about 500° C. to up to about 1,140° C. (the Curie temperature for lithium niobate) and most preferably from about 750° C. up to about 1,140° C. The higher temperatures are preferred because they provide a greater increase in the ability of the crystal to reduce surface charging compared to temperatures near the lower end of the ranges. For oven temperatures closer to the lower end of the ranges noted above, an increase in the ability of the crystal to reduce surface charging is observed, but the increase is not as great compared to the increase observed at the higher temperatures. An increase in the ability of the crystals to reduce surface charging is also observed at temperatures below about 500° C. although such increases are less than those observed at temperatures greater than 500° C. As discussed above, depending upon the effect of the preconditioning on other properties of the crystal, the lower temperatures may be suitable and in fact preferred.

The dwell times that the crystals are exposed to the target temperature in accordance with the present invention can vary. Increasing the dwell times for a given target temperature and atmosphere should increase the ability of a crystal to reduce surface charge build up compared to crystals exposed to the target temperature for shorter dwell times. Shorter dwell times are preferred from the standpoint of minimizing process times and energy requirements for the process.

In accordance with one method of carrying out a process in accordance with the present invention, towards the end of the quenching step the atmosphere around the crystals can slowly be converted to an oxidizing atmosphere once the crystals reach a temperature of about 100° C. or less. Avoiding contact of the crystals with an oxidizing atmosphere at temperatures above 100° C. is preferred in order to avoid the oxidation of the already reduced crystals.

As set forth in more detail below in the Comparative Example and the Example that follows, preconditioned LN crystal wafers of the present invention that have been exposed to conditions that invoke a natural pyroelectric response, exhibit surface charges that are less than the surface charges observed on conventional LN wafers that have not been preconditioned and have been exposed to the same conditions.

Comparative Example

This comparative example illustrates the natural pyroelectric response of a conventional LN crystal that has not been preconditioned in accordance with the present invention.

A wafer of LN 76 mm in diameter and 0.5 mm thick oriented with the surface normal to the 64° rotated y-direction was prepared using the Czochralski method and a conventional fabrication method. The wafer was polished on one side and was colorless and translucent. The wafer was electrically neutralized on a hot plate at 125° C. Following electrical neutralization, the wafer was cooled to 80° C. over 45 minutes and held at 80° C. using the same hot plate. Using a laboratory electrostatic field meter available under the trademark Digital Stat-Arc 2, Model No. 282-1 from Monroe Electronics, the wafer surface was measured to have a charge of at least $5 \times 10^{-9}$ coulombs based on the total surface area of the wafer. The surface charge was monitored continuously and recorded every five minutes. After roughly about one hour at 80° C. the surface charge was remeasured and observed to decay slowly to approximately 60 percent of the original surface charge. It was only after an extended period of about 15 hours at 80° C., that the total surface charge was observed to dissipate to a level below $5 \times 10^{-11}$ coulombs based on the total surface area of the wafer at 80° C., the detection limit of the electrostatic field meter.

In this comparative example the surface charge and its decay was observed at 80° C. At room temperature the length of time needed to allow the surface charge to decay below detectable limits would be even longer.

This comparative example illustrates the surface charging of an LN wafer resulting from the natural pyroelectric response of LN and the length of time needed to naturally dissipate the built-up charge.

EXAMPLE

In this example, LN wafers are preconditioned to increase their ability to reduce surface charging in accordance with the present invention.

Wafers of LN were cut from the same boule that served as the source of the wafer in the Comparative Example. The wafers were polished and lapped in an identical manner as the wafer described in the Comparative Example. These wafers were placed in a sealed oven through which a mixture of 85% nitrogen gas and 15% hydrogen gas was flowed at a rate of approximately 1.5 liters per minute. The oven comprised a three-zone tube furnace with a horizontal, 4-inch diameter alumina process tube. The wafers were supported by alumina carriers placed in the center of the process tube. The alumina process tube extended out of the furnace so that its ends were exposed and remained cool. O-ring seals on the alumina process tube provided a sealed furnace cavity. The wafer was loaded into the process tube, which was then sealed with end caps. The gas flow was initiated and the furnace heating schedule begun. The furnace temperature was increased from room temperature to the target temperature at a rate of about 6.7° C. per minute. Once the target temperature was reached, the temperature was maintained for a predetermined dwell time. After the dwell time, the furnace was allowed to cool naturally, while the crystals remained in the chemically reducing atmosphere until their temperature reached less then 100° C. After reaching less than about 100° C., the atmosphere around the crystals was slowly changed to an oxidizing atmosphere by introduction of air into the oven. After reaching room temperature, the wafers were removed from the furnace and their visual appearance was observed qualitatively and recorded. X-ray diffraction analysis confirmed the original crystal structure of the material. The preconditioned wafers were subjected to the same hot plate treatment described in the Comparative Example to ascertain the surface charge of the wafers after being exposed to a temperature change and the charge decay time required for the surface charge to fall below the $5\times10^{-11}$ coulomb lower detection limit of the electrostatic field meter. For those wafers where the target temperature was set at 500° C. or greater and the wafer wherein the target temperature was 400° C. and the dwell time was 200 minutes, the surface charge measured immediately before, during and after completion of cooling to 80° C. was below the detection limit of the electrostatic field meter. From this observation, it was presumed that the charge had decayed in less than 1 second. The surface resistivity of the wafers was determined using a Keithley Instruments Model 487 picoammeter/voltage source together with a Model 8008 resistivity test fixture. The surface resistivity was measured by applying a voltage of 200 volts across the circular gap between the two electrodes. The electrodes were circular (one larger doughnut-shaped electrode, and a smaller circular-shaped one located within the larger electrode) and were contacted to the polished wafer surface using conductive rubber. The "effective perimeter" of the circular electrode was 16.97 centimeters (6.68 inches) and the gap width was 0.32 centimeters (⅛ of an inch). The surface resistivity $\rho$ is given by $6.68/0.25\times U/I=53.4\times U/I$, where U is the 200 volts applied, and I was the current across the gap read about one minute after applying the voltage, when the display was stable. The results are summarized in Table 1.

TABLE 1

| Furnace Target Temperature (° C.) | Dwell Time (minutes) | Color | Surface Charge (coulombs) | Surface Resistivity (ohms) | Charge Decay Time at 80° C. (hrs) |
|---|---|---|---|---|---|
| 80° C. (Comparative Example) | — | colorless/translucent | 5.0 E$^{-9}$ | — | 16+ |
| 400 | 1 | very light grey-colorless/translucent | 5.0 E$^{-9}$ | 9.11 E + 13 | 16+ |
| 400 | 200 | grey/translucent | <5.0 E$^{-11}$ | — | <1 sec |
| 500 | 1 | grey/translucent | <5.0 E$^{-11}$ | 1.2 E + 14 | <1 sec |
| 550 | 1 | grey/translucent | <5.0 E$^{-11}$ | — | <1 sec |
| 650 | 1 | dark grey/translucent | <5.0 E$^{-11}$ | 1.8 E + 12 | <1 sec |
| 700 | 1 | black/opaque | <5.0 E$^{-11}$ | — | <1 sec |
| 750 | 1 | black/opaque | <5.0 E$^{-11}$ | 2.1 E + 10 | <1 sec |
| 800 | 1 | black/opaque | <5.0 E$^{-11}$ | 6.4 E + 10 | <1 sec |
| 1030 | 1 | black/opaque | <5.0 E$^{-11}$ | 1.7 E + 8 | <1 sec |

This example illustrates how preconditioned LN crystal wafers of the present invention effectively reduce charging of the surface of an LN crystal wafer.

It is believed that the concepts of the present invention can easily be applied to various LN or LT crystals having a wide variety of physical characteristics, such as wafers of varying diameters, thicknesses and orientations. This can be accomplished by selecting appropriate furnace temperatures, dwell times, chemically reducing atmospheres and other parameters. The concepts of the present invention could also be applied to wafers either before or after the wafers have been polished, or even to slabs of crystal material. In addition, the method of the present invention may be performed at different stages of the manufacturing of devices, such as after cleaning or metal deposition on the wafers.

The advantages provided by preconditioned crystals of the present invention and the method of preconditioning crystals in accordance with the present invention are applicable to LN and LT crystals that are subjected to manufacturing conditions that invoke either a pyroelectric or piezoelectric response that results in the buildup of unwanted surface charges. The ability of crystals preconditioned in accordance with the present invention to reduce the build up of surface charges is not believed to adversely affect the ability of the crystal to perform in its intended manner. For instance, for SAW based devices, the frequency of the mechanical stress encountered in normal operation and the resulting response is high enough that any increase in the rate of dissipation of the surface charge buildup, resulting from preconditioning the crystal in accordance with the present invention does not affect the performance of the device incorporating the crystal. On the other hand, the preconditioned crystals of the present invention are able to effectively reduce the unwanted surface charge buildup resulting from temperature changes or mechanical stresses originating from the process of manufacturing the device in which the crystal is incorporated, or occurring during use of the device, because the frequency of the mechanical stress or temperature change is much less than the frequency encountered in normal operation.

The embodiments of the invention in which an exclusive property or privilege is claimed are defined as follows:

1. A method for preconditioning a lithium niobate or lithium tantalate crystal to increase the crystal's ability to reduce electric charging of the crystal surface comprising:

heating the crystal under a chemically reducing atmosphere to a first temperature; and quenching the crystal by reducing its temperature to below a second temperature of about 250° C. under a chemically reducing atmosphere;

wherein the chemically reducing atmosphere, the first temperature and the second temperature are selected so that following heating and quenching, a charge decay time of less than one second is required to reduce the surface charge of the crystal to less than 5.0×10–11 coulombs as measured at a temperature of 80° C. following heating to a temperature of 125° C.

2. The method of claim 1, wherein the crystal is quenched by reducing its temperature to between about 250° C. to about 100° C. under a chemically reducing atmosphere.

3. The method of claim 2, further comprising a step of cooling the quenched crystal to room temperature under an oxidizing atmosphere.

4. The method of claim 1, wherein the heating step involves heating the crystal to a temperature greater than 400° C.

5. The method of claim 4, wherein the heating step involves heating the crystal to a temperature ranging between about 400° C. to about 1,140° C.

6. The method of claim 1, wherein the chemically reducing atmosphere comprises gases selected from argon, water, hydrogen, nitrogen, carbon dioxide, carbon monoxide, and combinations thereof.

* * * * *